(12) United States Patent
Kaylani et al.

(10) Patent No.: US 8,772,915 B2
(45) Date of Patent: *Jul. 8, 2014

(54) MASK PROGRAMMABLE INTERFACE SELECTION

(75) Inventors: Tarek Kaylani, Irvine, CA (US); Zhihui Wang, Irvine, CA (US); Kenneth Kindsfater, Laguna Niguel, CA (US); Balasubramanian Annamalai, Karnataka (IN); Jeff Echtenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/174,260

(22) Filed: Jun. 30, 2011

(65) Prior Publication Data
US 2011/0254158 A1 Oct. 20, 2011

Related U.S. Application Data

(63) Continuation of application No. 11/724,135, filed on Mar. 14, 2007, now Pat. No. 7,982,294.

(51) Int. Cl.
*H01L 23/48* (2006.01)

(52) U.S. Cl.
USPC .... 257/678; 257/686; 257/777; 257/E25.013; 257/737; 257/E23.01

(58) Field of Classification Search
USPC .......................... 257/678, 686, 777, E25.013
See application file for complete search history.

(56) References Cited

U.S. PATENT DOCUMENTS

| 6,420,781 B1 * | 7/2002 | Wendorff et al. | 257/686 |
| 8,169,068 B2 * | 5/2012 | Wu et al. | 257/690 |

* cited by examiner

*Primary Examiner* — Cathy N Lam
(74) *Attorney, Agent, or Firm* — McDermott Will & Emery LLP

(57) ABSTRACT

According to one exemplary embodiment, a semiconductor die with on-die preferred interface selection includes at least two groups of pads situated on an active surface of the semiconductor die, where each of the at least two groups of pads is coupled to its associated interface in the die. A set of bumps is mask-programmably routed to one of the at least two groups of pads, thereby selecting the preferred interface for the semiconductor die. A non-preferred interface is not routed to any bumps on the active surface of the semiconductor die, thereby reducing bump count on the die. Each of the at least two groups of pads can be situated in a corresponding pad ring on the active surface of said semiconductor die. The at least two groups of pads can be laid out substantially inline.

20 Claims, 5 Drawing Sheets

MASK PROGRAMMABLE INTERFACE SELECTION

This is a continuation of application Ser. No. 11/724,135 filed Mar. 14, 2007.

BACKGROUND OF THE INVENTION

1. Field of the Invention

The present invention is generally in the field of semiconductor fabrication. More particularly, the invention is in the field of semiconductor die fabrication and packaging.

2. Background Art

A semiconductor die can be surface mounted to a package substrate employed to house the die by using flip chip technology. In flip chip technology, the semiconductor die is "flipped" over so that the active surface of the die faces the package substrate. Electrical contact between the semiconductor die and the package substrate is achieved through solder bumps (also referred to simply as "bumps" in the present application) that are placed on the active surface of the semiconductor die. In a conventional "flip chip," each semiconductor die pad (also referred to simply as a "pad" in the present application) situated on the active surface of the die is connected to its corresponding unique bump using a pad-to-bump routing layer on the die. The semiconductor die also includes a core, which can include different types of interfaces, such as digital and analog interfaces.

In a conventional semiconductor die, each interface in the core is typically coupled to corresponding pads and bumps on the active surface of the die. However, some applications may require selection of one type of interface in the semiconductor die, such as a digital interface, and other applications may require selection of a different type of interface, such as an analog interface. An unselected interface (also referred to as a non-preferred interface in the present application) in a conventional semiconductor die is typically disabled at the package level. However, in the conventional semiconductor die, an unselected interface is still coupled to bumps on the die, which are unused. Since the manufacturing cost of a semiconductor die is generally determined by core area and the number of pads and bumps, any unused bumps corresponding to an unselected interface increase the bump count on the die, thereby undesirably increasing manufacturing cost.

SUMMARY OF THE INVENTION

Semiconductor die with mask programmable interface selection substantially as shown in and/or described in connection with at least one of the figures, as set forth more completely in the claims.

DETAILED DESCRIPTION OF THE INVENTION

The present invention is directed to a semiconductor die with mask programmable interface selection. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
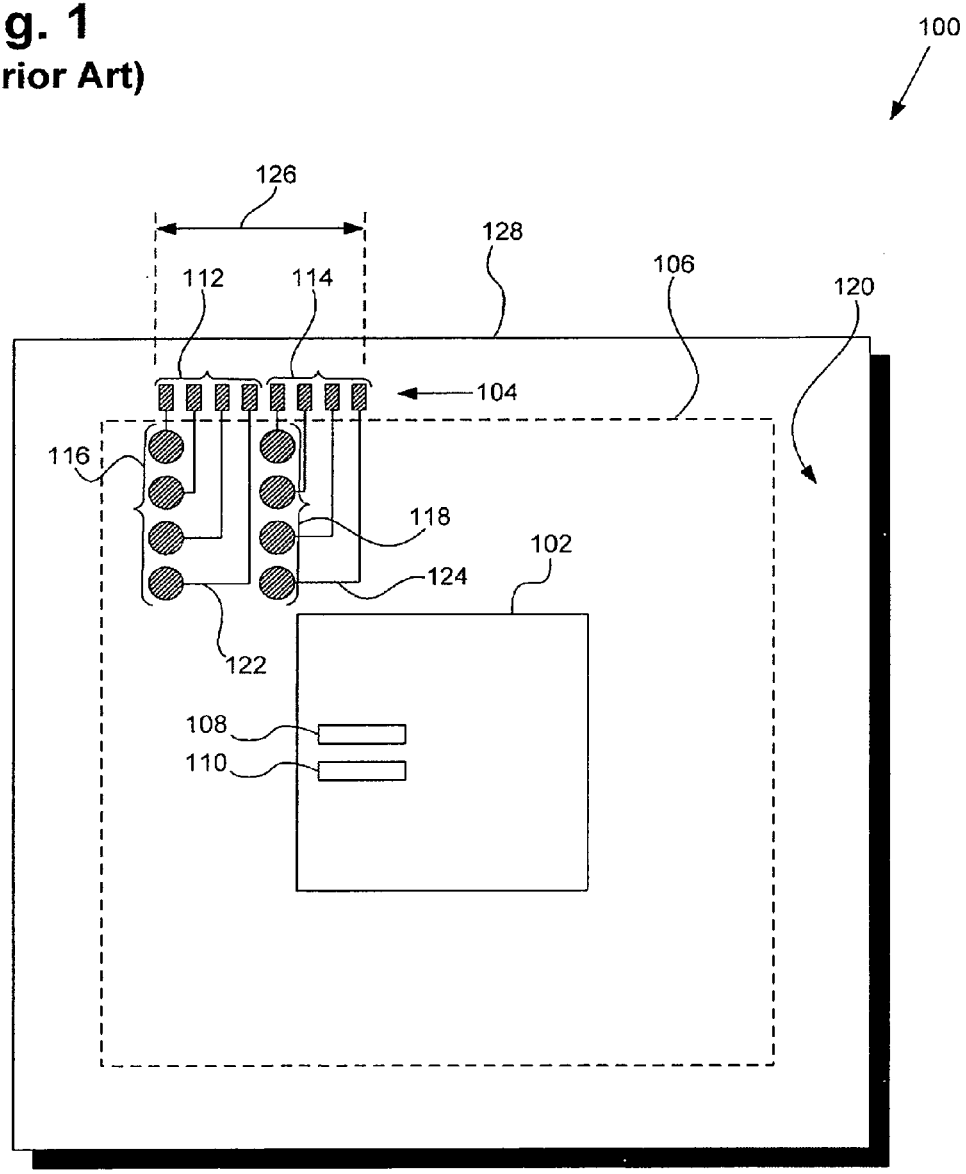
FIG. 1 shows a top view of an exemplary conventional semiconductor die.

FIG. 1 shows a top view of conventional semiconductor die 100. Conventional semiconductor die 100 includes core 102, pad ring 104, and bump array 106. It is noted that a "semiconductor die," such as conventional semiconductor die 100, is also referred to as a "chip" or a "semiconductor chip" in the present application. Core 102 includes interfaces 108 and 110, pad ring 104 includes a number of pads, such as pads 112 and pads 114, and bump array 106 includes a number of bumps (i.e. solder bumps), such as bumps 116 and bumps 118. Conventional semiconductor die 100 can utilize flip chip packaging technology, wherein the die can be "flipped" to allow bump array 106 on active surface 120 of the die to make direct electrical contact with a package substrate (not shown in FIG. 1). It is noted that although pad ring 104 can include a large number of pads and bump array 106 can include a large number of bumps, only pads 112, pads 114, bumps 116, and bumps 118 are shown in FIG. 1 to preserve brevity.

As shown in FIG. 1, pad ring 104 is situated on the perimeter of active surface 120 of conventional semiconductor die 100 and includes a number of pads, such as pads 112 and pads 114. Pads 112 and pads 114 extend distance 126 along edge 128 of conventional semiconductor die 100. Also shown in FIG. 1, bump array 106 is situated on active surface 120 of conventional semiconductor die 100 and includes a number of bumps, such as bumps 116 and bumps 118. Further shown in FIG. 1, each of bumps 116 are connected to one of pads 112 by a metal line, such as metal line 122, and each of bumps 118 are connected to one of pads 114 by a metal line, such as metal line 124. Metal lines 122 and 124 are situated in a pad-to-bump routing layer (also referred to simply as a "routing layer" in the present application), which can be a redistribution layer (RDL), for example.

Also shown in FIG. 1, core 102 is situated over a substrate (not shown in FIG. 1) in conventional semiconductor die 100. Core 102 can include interfaces 108 and 110, as well as other circuits, which are not shown in FIG. 1. For example, interface 108 can be a digital interface and interface 110 can be an analog interface. Interfaces 108 and 110 can be coupled to pads 112 and pads 114, respectively. In conventional semiconductor die 100, an application may require interface 108 to be selected and interface 110 to be unselected, and vice versa. However, since respective interfaces 108 and 110 are routed to bumps 116 and bumps 118 on the die, the unselected interface (also referred to as a non-preferred interface in the present application) must be disabled at the package level.

However, since unused bumps that are coupled to the unselected interface remain on active surface 120 of conventional semiconductor die 100, the unused bumps contribute to the total bump count, thereby undesirably increasing manufacturing cost. Also, if interface 108, which is coupled to pads 112, is unselected, pads 112, which consume valuable pad ring space along the periphery of the die, are unused. Thus, in conventional semiconductor die 100, an interface that is unselected results in corresponding unused bumps on the active surface of die, which undesirably increase bump count. The unselected interface also results in corresponding unused pads on the active surface of the die, which consume valuable pad ring space along the periphery of the die.

Figure 2:
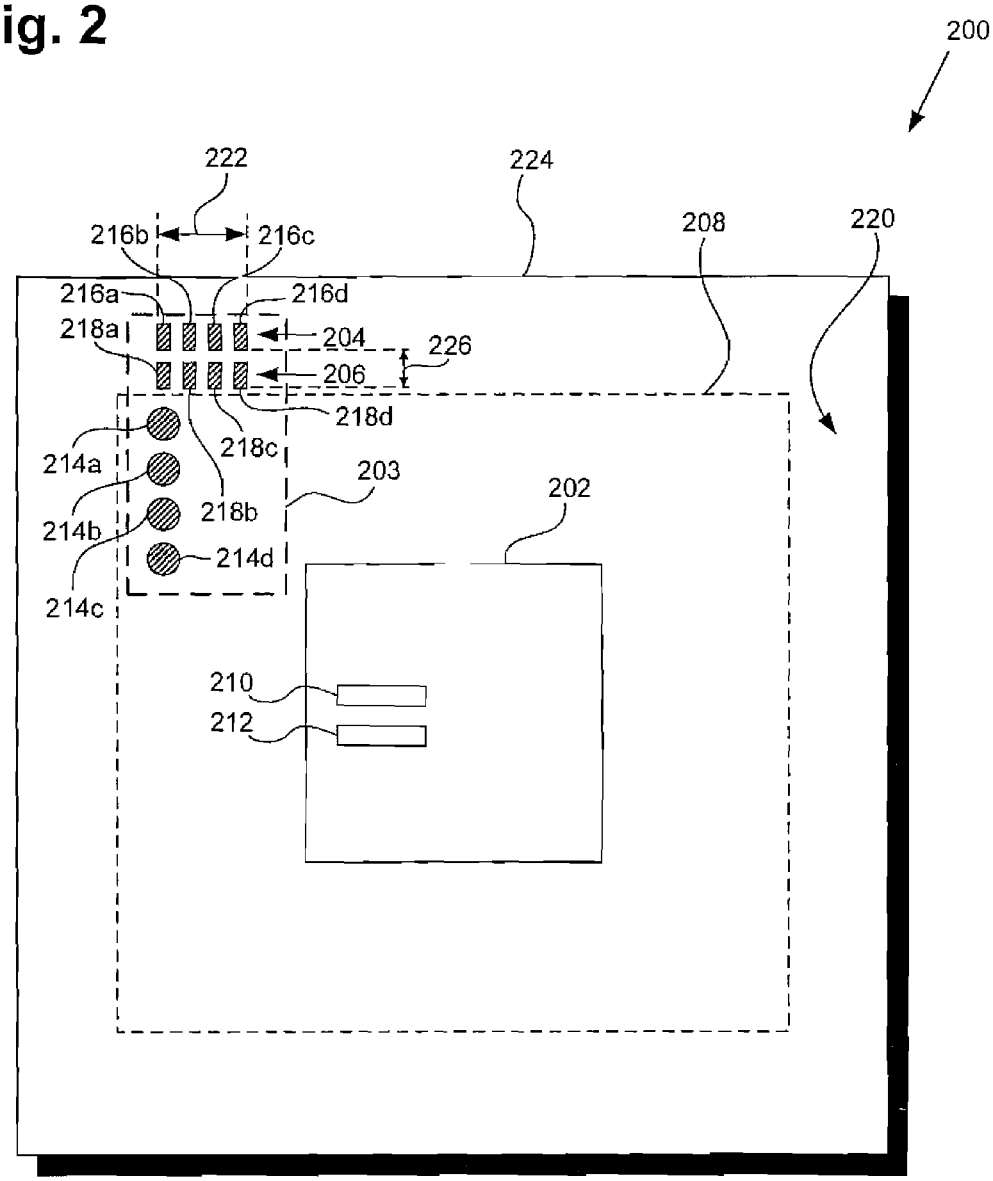
FIG. 2 shows a top view of an exemplary semiconductor die in accordance with one embodiment of the present invention.

FIG. 2 shows a top view of semiconductor die 200 in accordance with one embodiment of the present invention. In FIG. 2, semiconductor die 200 is shown prior to programming a bump routing configuration for on-die preferred interface selection. Semiconductor die 200 includes core 202, pad rings 204 and 206, and bump array 208. Core 202 includes interfaces 210 and 212 and bump array 208 includes a number of bumps, such as bumps 214a, 214b, 214c, and 214d (hereinafter "bumps 214a through 214d"). Pad ring 204 includes pads 216a, 216b, 216c, and 216d (hereinafter "pads 216a through 216d") and pad ring 206 includes pads 218a, 218b, 218c, and 218d (hereinafter "pads 218a through 218d"). Semiconductor die 200 can utilize flip chip packaging technology, wherein the die can be "flipped" to allow bump array 208 on active surface 220 of the die to make direct electrical contact with a package substrate (not shown in FIG. 2). It is noted that semiconductor die 200 can include a large number of pads situated along the periphery of the die and can also include a large number of bumps situated in bump array 208. However, only pads 216a through 216d, pads 218a through 218d, and bumps 214a through 214d are shown in FIG. 2 to preserve brevity and to avoid obscuring the present invention.

As shown in FIG. 2, semiconductor die 200 includes core 202, which can be situated over a semiconductor substrate (not shown in FIG. 2) in the die. Core 202 can include two or more interfaces, such as interfaces 210 and 212, as well as other circuits, which are not shown in FIG. 2. Interfaces 210 and 212 can be "mutually exclusive" interfaces, wherein both interfaces are not required to be active simultaneously on the semiconductor die, such as digital and analog interfaces. In other words, when semiconductor die 200 is utilized in an application that requires interface 210 to be active, interface 212 is inactive, and vice versa. For example, interface 210 can be a digital interface, such as a digital video output (DVO) interface, and interface 212 can be an analog interface, such as a low voltage differential signaling (LVDS) interface. In one embodiment, interfaces 210 and 212 can be interfaces with different IO characteristics, such as a Bluetooth interface and a Universal Serial Bus (USB) interface. The present invention utilizes on-die mask programmable routing to route a preferred interface, such as a preferred one of two mutually exclusive interfaces, to a set of bumps on the active surface of the die, where the preferred interface is selected for an intended use of the die. The term "preferred interface" is used in the present application as a convenient short-hand reference to a user-selected or application-specific interface (hence a "preferred interface"). However, an interface that might be "preferred" in a certain application or by a certain user, may be non-preferred in a different application or by a different user.

Also shown in FIG. 2, pads 216a through 216d in pad ring 204 and pads 218a through 218d in pad ring 206 are situated on active surface 220 of semiconductor die 220 and can be coupled to respective interfaces 210 and 212 in core 202 in semiconductor die 200. In one embodiment, pads from different pad rings can be coupled to each of two interfaces in the die. Pads 216a through 216d and pads 218a through 218d can comprise a metal such as copper or aluminum and can be formed in a top interconnect metal layer in the die. In the present embodiment, pads 216a through 216d in pad ring 204 are laid out substantially inline with respective pads 218a through 218d in pad ring 206. Thus, pad 216a is laid out substantially inline with respect to pad 218a, pad 216b is laid out substantially inline with respect to pad 218b, and so on. In another embodiment, pads 216a through 216d in pad ring 204 can be arranged in a different alignment configuration with respect to pads 218a through 218d in pad ring 206.

Further shown in FIG. 2, pads 216a through 216d and pads 218a through 218d extend distance 222 along the periphery of semiconductor die 200 and pads 218a through 218d extend distance 226 below pads 216a through 216d in a direction perpendicular to edge 224. By arranging pad rings 204 and 206 in an inline configuration, the pad ring extension along the periphery of the die, i.e., distance 222, is reduced by approximately fifty percent compared to distance 126 in FIG. 1, i.e., the pad ring extension resulting from the single pad ring arrangement utilized in conventional semiconductor die 100. As a result, the embodiment of the invention in FIG. 2 advantageously achieves a significant reduction in semiconductor die peripheral space compared to conventional semiconductor die 100. Although the inline pad ring arrangement increases pad ring extension by distance 226 in a direction perpendicular to edge 224 of semiconductor die 200, distance 226 does not significantly affect die area.

Also shown in FIG. 2, bumps 214a through 214c are situated on active surface 220 of semiconductor die 200. In the present embodiment, bumps 214a through 214c can be mask-programmably routed to one of at least two groups of pads, e.g., a group of pads including pads 216a through 216d or a group of pads 218a through 218d, to select a preferred interface, e.g., interface 108 or interface 110, to be active for semiconductor die 200. For example, bumps 214a through 214c can be routed to either pads 216a through 216d or pads 218a through 218d by utilizing respective masks to appropriately program metal lines in a routing layer. In the present embodiment, an RDL (redistribution layer) can be utilized as a routing layer. An RDL mask can be utilized to program appropriate metal lines in the RDL.

In the present invention, a preferred interface can be selected for the semiconductor die by utilizing an appropriate mask-programmed bump routing configuration. Mask-programmed routing configurations for selecting respective interfaces 212 and 210 in semiconductor die 200 are discussed below in relation to FIGS. 3 and 4.

Figure 3:
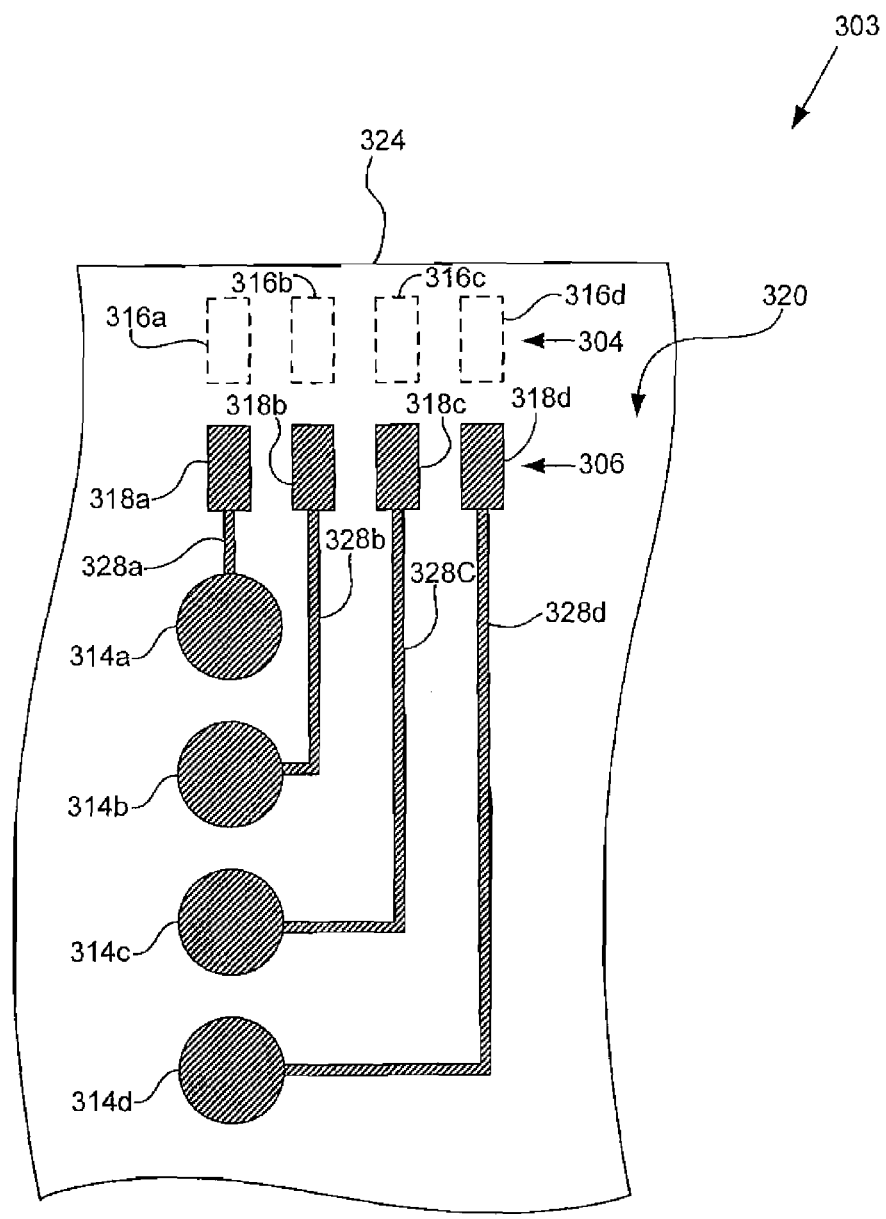
FIG. 3 shows a top view of a portion of the exemplary semiconductor die of FIG. 2 including a programmed interface configuration.

FIG. 3 shows a top view of a portion of semiconductor die 200 of FIG. 2 including a mask-programmed routing configuration for selecting a preferred interface in the die. In FIG. 3, portion 303 corresponds to the portion of semiconductor die 200 indicated by dashed line 203 in FIG. 2. In particular, pad rings 304 and 306, bumps 314a, 314b, 314c, and 314d (hereinafter "bumps 314a through 314d"), pads 316a, 316b, 316c, and 316d (hereinafter "pads 316a through 316d"), pads 318a, 318b, 318c, and 318d (hereinafter "pads 318a through 318d"), active surface 320, and edge 324 correspond, respectively, to pad rings 204 and 206, bumps 214a through 214d, pads 216a through 216d, pads 218a through 218d, active surface 220, and edge 224 in FIG. 2.

As shown in FIG. 3, respective metal lines 328a, 328b, 328c, and 328d (hereinafter "metal lines 328a through 328d"), which are situated in a routing layer, i.e., a pad-to-bump routing layer, on active surface 320, route bumps 314a through 314d to pads 318a through 318d, which are coupled to its associated interface, i.e., interface 212, in semiconductor die 200. In the mask-programmed routing configuration in FIG. 3, the routing layer can be an RDL, which can be programmed by using an appropriate RDL mask to pattern metal lines 328a through 328d. In one embodiment, bump routing between bumps 314a through 314d and pads 318a through 318d can be achieved by utilizing an appropriate mask or masks to pattern metal lines in one or more interconnect metal layers in the semiconductor die.

In the mask-programmed routing configuration in FIG. 3, interface 212 in FIG. 2 is routed to bumps 314a through 314d, which causes interface 212 to be selected, i.e., to be active, on semiconductor die 200. Also, since interface 210 in FIG. 2 is coupled to pads 316a through 316d but not routed to bumps 314a through 314d, it (i.e. interface 210) is unselected on semiconductor die 200. Thus, in the mask-programmed routing configuration in FIG. 3, interface 210, which is unselected (also referred to as a non-preferred interface in the present application), is not routed to any bumps on active surface 320, which advantageously reduces the bump count of the semiconductor die.

Figure 4:
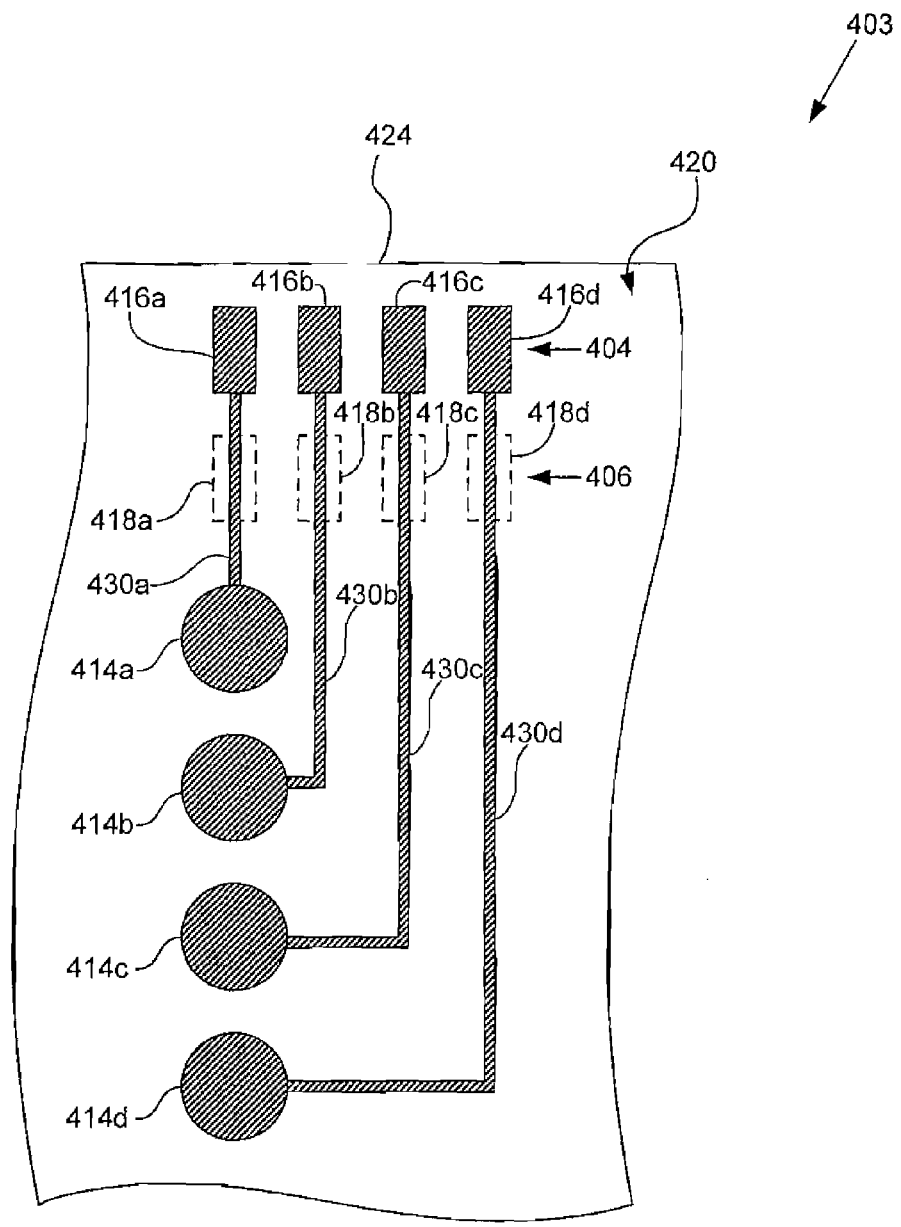
FIG. 4 shows a top view of a portion of the exemplary semiconductor die of FIG. 2 including a programmed interface configuration.

FIG. 4 shows a top view of a portion of semiconductor die 200 of FIG. 2 including a mask-programmed routing configuration for selecting a preferred interface in the die. In FIG. 4, portion 403 corresponds to the portion of semiconductor die 200 indicated by dashed line 203 in FIG. 2. In particular, pad rings 404 and 406, bumps 414a, 414b, 414c, and 414d (hereinafter "bumps 414a through 414d"), pads 416a, 416b, 416c, and 416d (hereinafter "pads 416a through 416d"), pads 418a, 418b, 418c, and 418d (hereinafter "pads 418a through 418d"), active surface 420, and edge 424 correspond, respectively, to pad rings 204 and 206, bumps 214a through 214d, pads 216a through 216d, pads 218a through 218d, active surface 220, and edge 224 in FIG. 2.

As shown in FIG. 4, respective metal lines 430a, 430b, 430c, and 430d (hereinafter "metal lines 430a through 430d"), which are situated in a routing layer, i.e., a pad-to-bump routing layer, on active surface 420, route bumps 414a through 414d to pads 416a through 416d, which are coupled to its associated interface, i.e., interface 210, in semiconductor die 200. In the mask-programmed routing configuration in FIG. 4, the routing layer can be an RDL, which can be programmed by using an appropriate RDL mask to pattern metal lines 430a through 430d. In one embodiment, routing between bumps 414a through 414d and pads 416a through 416d can be achieved by utilizing an appropriate mask or masks to pattern metal lines in one or more interconnect metal layers in the semiconductor die.

In the mask-programmed routing configuration in FIG. 4, interface 210 in FIG. 2 is routed to bumps 416a through 416d, which causes interface 210 to be selected on semiconductor die 200. Also, since interface 212 in FIG. 2 is coupled to pads 418a through 418d but not routed to bumps 414a through 414d, it (i.e. interface 212) is unselected on semiconductor die 200. Thus, in the mask-programmed routing configuration in FIG. 4, interface 212, which is unselected, is not routed to any bumps on active surface 420, which reduces the bump count of the semiconductor die.

Figure 5:
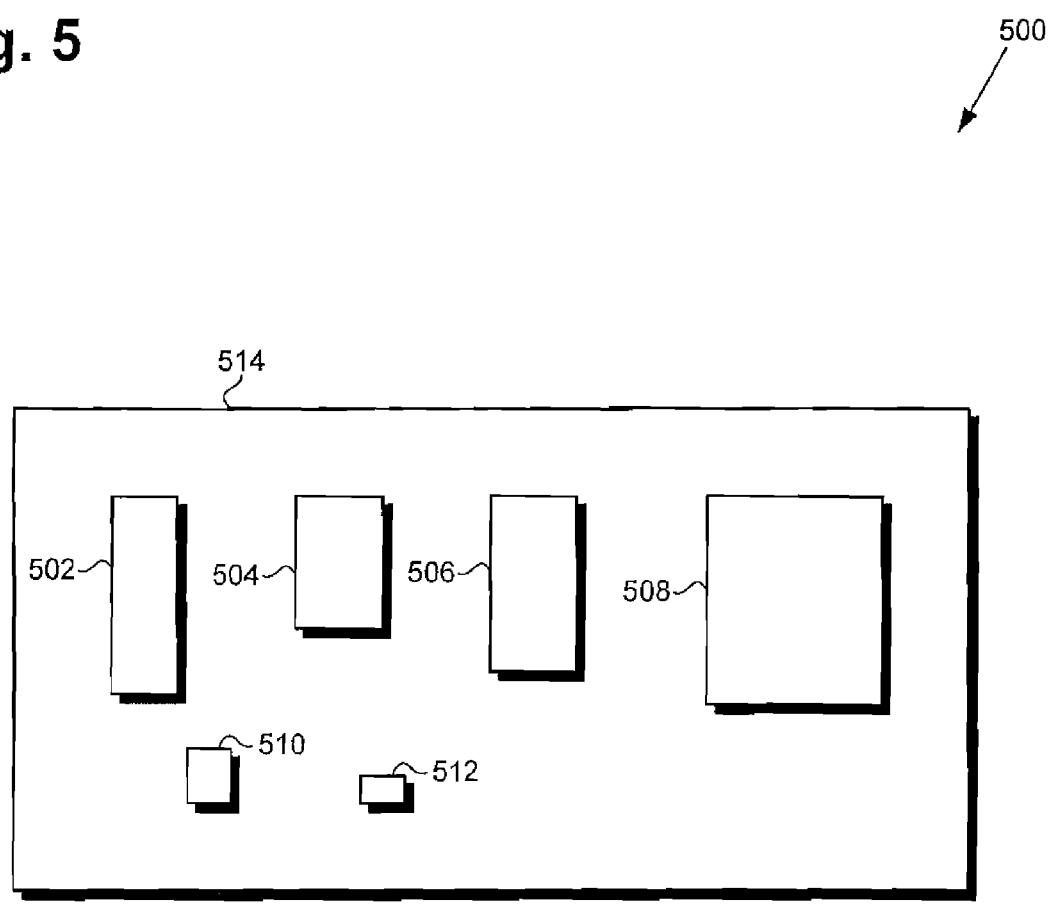
FIG. 5 is a diagram of an exemplary electronic system including an exemplary semiconductor die in accordance with one embodiment of the present invention.

FIG. 5 illustrates a diagram of an exemplary electronic system including an exemplary chip or die in accordance with one embodiment of the present invention. Electronic system 500 includes exemplary modules 502, 504, and 506, IC chip or semiconductor die 508, discrete components 510 and 512, residing in and interconnected through circuit board 514. In one embodiment, electronic system 500 may include more than one circuit board. IC chip 508 can comprise one of the invention's semiconductor dies, such as semiconductor die 200 in FIG. 2, including a mask-programmed routing configuration, such as the mask-programmed routing configuration shown in FIG. 3 or 4, as described above.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is surface mounted on circuit board 514 and comprises an embodiment of the invention's semiconductor die. In one embodiment, IC chip 508 may be mounted on a substrate in a semiconductor package, which can be in turn mounted on circuit board 514. In another embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, the present invention provides a semiconductor die that utilizes on-die mask-programmable routing to route a set of bumps on the die to one of at least two groups of pads, each of which are coupled its associated interface, to select a preferred interface for the die. In the present invention, an unselective interface is not routed to any bumps on the die, which reduces the bump count on the die. In contrast, in conventional semiconductor die 100 in FIG. 1, selected and unselected interfaces are routed to bumps on the die. Thus, the invention provides a semiconductor die having a reduced bump count compared to conventional semiconductor die 100, which advantageously reduces manufacturing cost. As a result, a semiconductor package including the invention's semiconductor die can be manufactured at a corresponding reduced cost.

In the present invention, preferred interface selection is achieved by utilizing different masks, such as RDL masks, to appropriately program respective routing configurations on the die during wafer fabrication. Thus, by utilizing the present invention, one or more wafers can be programmed with one mask to provide semiconductor dies having one of two interfaces selected and one or more wafers can be programmed with another mask to provide semiconductor dies having the other interface selected.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a semiconductor die with mask programmable interface selection has been described.

The invention claimed is:

1. A semiconductor die comprising:
   at least two groups of pads situated on an active surface of said semiconductor die, one of said at least two groups of pads being coupled to a first interface in said semiconductor die and another of said at least two groups of pads being coupled to a second interface in said semiconductor die;
   a plurality of bumps being mask-programmably routed to said one of said at least two groups of pads, thereby selecting said first interface for said semiconductor die;
   wherein said second interface is not routed to any bumps on said active surface of said semiconductor die.

2. The semiconductor die of claim 1, wherein each of said at least two groups of pads is situated in a corresponding pad ring on said active surface of said semiconductor die.

3. The semiconductor die of claim 2, wherein said at least two groups of pads are laid out substantially inline.

4. The semiconductor die of claim 1, wherein one of said first interface and said second interface is a digital interface and the other of said first interface and said second interface is an analog interface.

5. The semiconductor die of claim 1, wherein said first interface and said second interface are mutually exclusive interfaces.

6. The semiconductor die of claim 1, wherein said plurality of bumps is routed to said one of said at least two groups of pads in a redistribution layer on said semiconductor die.

7. The semiconductor die of claim 1, wherein said plurality of bumps is routed to said one of said at least two groups of pads in at least one interconnect metal layer of said semiconductor die.

8. A semiconductor package including a semiconductor die, said semiconductor die comprising:
   at least two groups of pads situated on an active surface of said semiconductor die, one of said at least two groups of pads being coupled to a first interface in said semiconductor die and another of said at least two groups of pads being coupled to a second interface in said semiconductor die;
   a plurality of bumps being mask-programmably routed to said one of said at least two groups of pads, thereby selecting said first interface for said semiconductor die;
   wherein said second interface is not routed to any bumps on said active surface of said semiconductor die.

9. The semiconductor package of claim 8, wherein each of said at least two groups of pads is situated in a corresponding pad ring on said active surface of said semiconductor die.

10. The semiconductor package of claim 9, wherein said at least two groups of pads are laid out substantially inline.

11. The semiconductor package of claim 8, wherein one of said first interface and said second interface is a digital interface and the other of said first interface and said second interface is an analog interface.

12. The semiconductor package of claim 8, wherein said first interface and said second interface are mutually exclusive interfaces.

13. The semiconductor package of claim 8, wherein said plurality of bumps is routed to said one of said at least two groups of pads in a redistribution layer on said semiconductor die.

14. The semiconductor package of claim 8, wherein said plurality of humps is routed to said one of said at least two groups of pads in at least one interconnect metal layer of said semiconductor die.

15. An electronic system comprising a semiconductor die, said semiconductor die comprising:
    at least two groups of pads situated on an active surface of said semiconductor die, one of said at least two groups of pads being coupled to a first interface in said semiconductor die and another of said at least two groups of pads being coupled to a second interface in said semiconductor die;
    a plurality of bumps being mask-programmably routed to said one of said at least two groups of pads, thereby selecting said first interface for said semiconductor die;
    wherein said second interface is not routed to any bumps on said active surface of said semiconductor die.

16. The electronic system of claim 15, wherein each of said at least two groups of pads is situated in a corresponding pad ring on said active surface of said semiconductor die.

17. The electronic system of claim 16, wherein said at least two groups of pads are laid out substantially inline.

18. The electronic system of claim 15, wherein one of said first interface and said second interface is a digital interface and the other of said first interface and said second interface is an analog interface.

19. The electronic system of claim 15, wherein said first interface and said second interface are mutually exclusive interfaces.

20. The electronic system of claim 15, wherein said electronic system is selected from a group consisting of a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, and a digital-controlled medical equipment.

* * * * *

UNITED STATES PATENT AND TRADEMARK OFFICE
CERTIFICATE OF CORRECTION

| | |
|---|---|
| PATENT NO. | : 8,772,915 B2 |
| APPLICATION NO. | : 13/174260 |
| DATED | : July 8, 2014 |
| INVENTOR(S) | : Tarek Kaylani et al. |

It is certified that error appears in the above-identified patent and that said Letters Patent is hereby corrected as shown below:

IN THE CLAIMS:

Column 7, Line 46

Replace "humps", with --bumps--.

Column 7, Line 49

Replace "humps", with --bumps--.

Column 8, Line 19

Replace "humps", with --bumps--.

Signed and Sealed this
Fourth Day of August, 2015

Michelle K. Lee
*Director of the United States Patent and Trademark Office*